United States Patent
Schwalbach et al.

(10) Patent No.: US 8,837,128 B2
(45) Date of Patent: Sep. 16, 2014

(54) ELECTRICAL COMPONENT FOR PORTABLE COMPUTING DEVICE

(71) Applicant: Apple Inc., Cupertino, CA (US)

(72) Inventors: Charles A. Schwalbach, Menlo Park, CA (US); Brandon S. Smith, Mountain View, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/250,279

(22) Filed: Apr. 10, 2014

(65) Prior Publication Data

US 2014/0226271 A1    Aug. 14, 2014

Related U.S. Application Data

(63) Continuation of application No. 13/492,694, filed on Jun. 8, 2012, now Pat. No. 8,717,748.

(51) Int. Cl.
  H01R 24/68    (2011.01)
  B23P 17/04    (2006.01)
  H05K 7/02     (2006.01)
  G06F 1/16     (2006.01)

(52) U.S. Cl.
  CPC ............. *G06F 1/1688* (2013.01); *H05K 7/02* (2013.01)
  USPC ........... 361/679.01; 361/679.27; 361/679.55; 248/160; 248/309.1; 248/316.1

(58) Field of Classification Search
  USPC ........... 361/679.27, 679.01, 679.55; 248/160, 248/309.1, 316.1; 29/428, 829, 832; 53/420
  See application file for complete search history.

(56) References Cited

U.S. PATENT DOCUMENTS

| | | | |
|---|---|---|---|
| 7,892,041 B2* | 2/2011 | Myers et al. | 439/680 |
| 2008/0318457 A1* | 12/2008 | Li et al. | 439/188 |
| 2009/0174990 A1* | 7/2009 | Ligtenberg et al. | 361/679.01 |
| 2010/0055989 A1* | 3/2010 | Su et al. | 439/675 |
| 2010/0254111 A1* | 10/2010 | Ligtenberg et al. | 361/816 |
| 2011/0081022 A1* | 4/2011 | Tamm et al. | 381/1 |
| 2012/0250911 A1* | 10/2012 | Tamm et al. | 381/300 |
| 2013/0328741 A1* | 12/2013 | Degner et al. | 343/841 |
| 2013/0328785 A1* | 12/2013 | Brooks et al. | 345/170 |
| 2013/0329450 A1* | 12/2013 | Degner et al. | 362/602 |
| 2013/0330962 A1* | 12/2013 | Tziviskos et al. | 439/489 |
| 2013/0330978 A1* | 12/2013 | Schwalbach et al. | 439/669 |
| 2014/0077670 A1* | 3/2014 | Degner et al. | 312/223.2 |
| 2014/0111914 A1* | 4/2014 | Leggett et al. | 361/679.1 |
| 2014/0111926 A1* | 4/2014 | Reid et al. | 361/679.09 |
| 2014/0111928 A1* | 4/2014 | Smith et al. | 361/679.27 |
| 2014/0111929 A1* | 4/2014 | Andre et al. | 361/679.27 |
| 2014/0112517 A1* | 4/2014 | Farahani et al. | 381/365 |

* cited by examiner

*Primary Examiner* — Robert J Hoffberg
*Assistant Examiner* — Michael Matey
(74) *Attorney, Agent, or Firm* — Womble Carlyle Sandridge & Rice LLP

(57) ABSTRACT

The present application describes various embodiments regarding an apparatus and method for providing an electrical component for a portable computing device. More specifically a method and apparatus are disclosed for mounting the electrical component to machined mounts extending from an interior sidewall of the portable computing device housing. The machined mounts allow the electrical component to be suspended above an inner surface of the portable computing device so that the electrical component does not interfere with audio output or aesthetics of a speaker grill drilled into the portable computing device housing.

21 Claims, 12 Drawing Sheets

ELECTRICAL COMPONENT FOR PORTABLE COMPUTING DEVICE

CROSS REFERENCE TO RELATED APPLICATIONS

This application is a continuation of U.S. application Ser. No. 13/492,694, filed Jun. 8, 2012, entitled "AUDIO JACK FOR PORTABLE COMPUTING DEVICE", which is herein incorporated by reference in its entirety.

FIELD

The embodiments described herein relate generally to portable computing devices. More particularly, the present embodiments relate to mounting an audio jack assembly to an inside surface of a portable computing device.

BACKGROUND

The outward appearance of a portable computing device, including its design and its heft, is important to a user of the portable computing device, as the outward appearance contributes to the overall impression that the user has of the portable computing device. At the same time, the assembly of the portable computing device is also important to the user, as a durable assembly will help extend the overall life of the portable computing device and will increase its value to the user.

One design challenge associated with the manufacture of portable computing devices is the design of the outer enclosures used to house the various internal components. This design challenge generally arises from a number of conflicting design goals that include the desirability of making the outer enclosure or housing lighter and thinner, and of including as many electrical components inside the outer enclosure as possible, among other possible goals. Conventionally designed portable computing devices generally include at least one audio jack directly attached to the portable computing device's main logic board. The audio jack generally enables low voltage connections between audio components. Unfortunately, such a configuration has a number of disadvantages. First, placement on the main logic board requires the main logic board be positioned proximate to one side of the portable computing device to allow the audio jack to line up with an opening in the portable computing device's housing. This positioning restriction can make arrangement of internal components more difficult for computing device designers and may result in a reduction in layout efficiency. Second, repeated insertion and removal of headphone or microphone connectors can put stress on the main logic board, in some cases causing damage to the main logic board and in other cases loosening of electrical connections between the audio jack and main logic board eventually resulting in audio jack failure. Finally, repair and replacement of an audio jack component is more difficult when attached directly to the main logic board. Removal can results in short circuits or damage to nearby electronic components, sometimes resulting in a costly and time consuming replacement of the entire main logic board.

Therefore, it would be beneficial to provide an improved audio jack assembly.

SUMMARY

The present application describes various embodiments regarding a system, method and apparatus for providing an attachment for an audio jack directly to an interior sidewall of a housing for a portable computing device.

In a first embodiment, an audio jack is disclosed which includes an audio jack housing. The audio jack housing includes: (1) a plurality of angled flanges extending laterally from the audio jack housing; (2) a cantilevered support beam extending from a lower surface of the audio jack housing which establishes a minimum stand off distance between the audio jack housing and an inner surface of a portable computing device housing; and (3) an angled connector portion for self aligning the audio jack assembly with an opening in an interior sidewall of the portable computing device housing.

In another embodiment a method for mounting an audio jack to a top case of a portable computing device is disclosed. The method includes the following steps: (1) machining two protruding features from an interior sidewall of the top case; (2) undercutting the two protruding features creating a small gap between an inner surface of the top case and the two protruding features; and (3) machining a number of speaker perforations into the top case. It should be noted that at least one of the speaker perforations opens into the small gap created during the undercutting step.

In yet another embodiment a portable computing device is disclosed. The portable computing device includes a portable computing device housing which includes the following: a perforated speaker grill having a number of speaker perforations configured to port audio from an audio module disposed within the portable computing device housing; and an audio jack module. The audio jack module includes the following: an audio jack housing; a number of angled flanges extending laterally from the audio jack housing; and a cantilevered support beam extending from a lower surface of the audio jack housing and establishing a minimum stand off distance between the audio jack housing and an inner surface of a portable computing device housing; and a number of audio jack mounts disposed on an interior sidewall of the portable computing device housing. It should be noted that the audio jack mount is undercut to prevent it from showing through the perforated speaker grill in the portable computing device housing.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for providing portable computing devices. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements, and in which.

DETAILED DESCRIPTION

Figure 1:
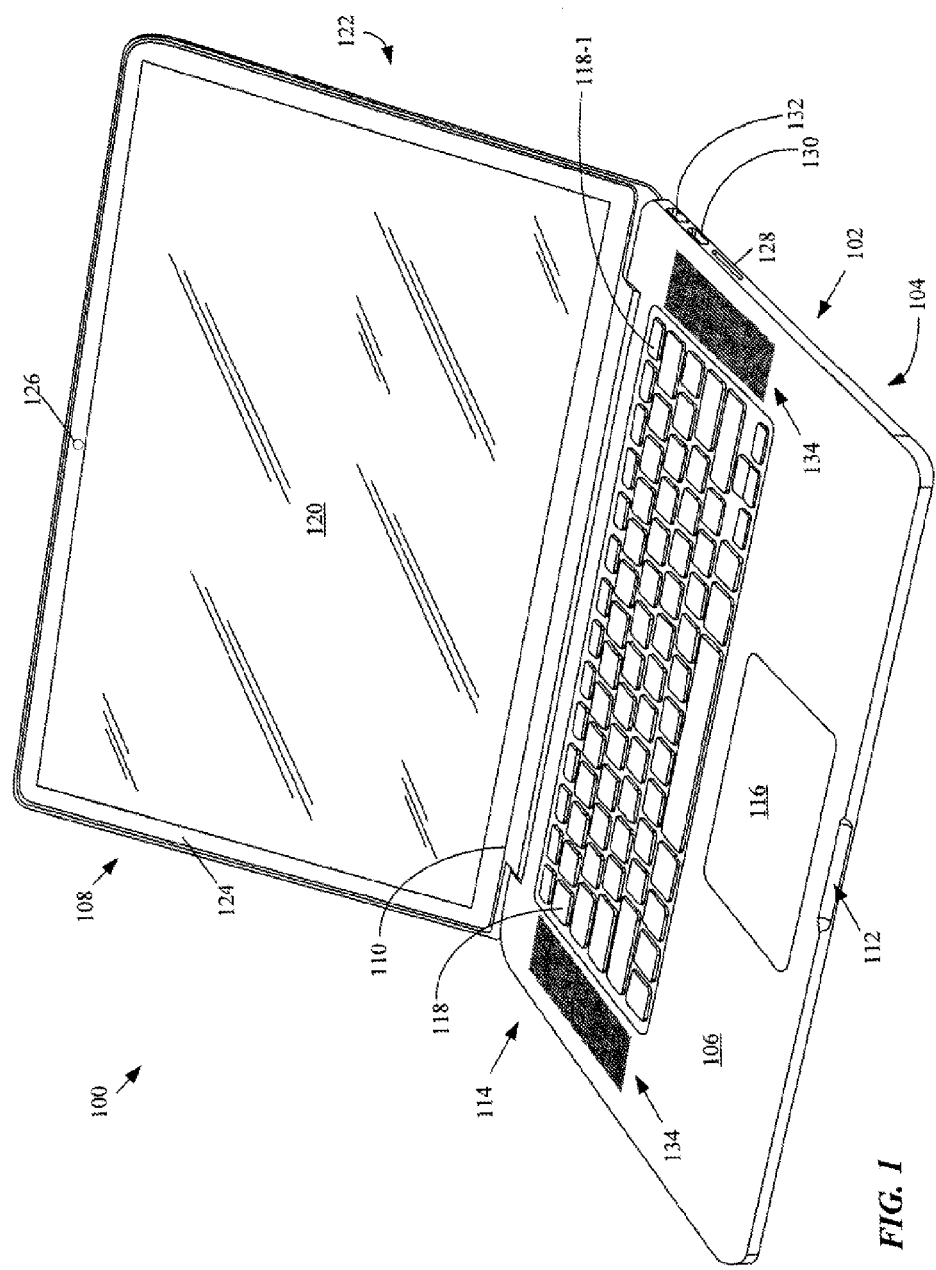
FIG. 1 shows a front facing perspective view of an embodiment of the portable computing device in the form of portable computing device in an open (lid) state.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a portable computing device such as a laptop computer, net book computer, tablet computer, etc. The portable computing device can include a multi-part housing having a top case and a bottom case joining at a reveal to form a base portion. The portable computing device can have an upper portion (or lid) that can house a display screen and other related components whereas the base portion can house various processors, drives, ports, battery, keyboard, touchpad and the like. The top case and the bottom case can each be joined in a particular manner at an interface region such that the gap and offset between top and bottom cases are not only reduced, but are also more consistent from device to device during the mass production of devices. These general subjects are set forth in greater detail below.

In a particular embodiment, the lid and base portion can be pivotally connected with each other by way of what can be referred to as a clutch assembly. The clutch assembly can be arranged to pivotally couple the base portion to the lid. The clutch assembly can include at least a cylindrical portion that in turn includes an annular outer region, and a central bore region surrounded by the annular outer region, the central bore suitably arranged to provide support for electrical conductors between the base portion and electrical components in the lid. The clutch assembly can also include a plurality of fastening regions that couple the clutch to the base portion and the lid of the portable computing device with at least one of the fastening regions being integrally formed with the cylindrical portion such that space, size and part count are minimized.

The multipart housing can be formed of a strong and durable yet lightweight material. Such materials can include composite materials and or metals such as aluminum. Aluminum has a number of characteristics that make it a good choice for the multipart housing. For example, aluminum is a good electrical conductor that can provide good electrical ground and it can be easily machined and has well known metallurgical characteristics. The superior conductivity of aluminum provides a good chassis ground for internal electrical components arranged to fit and operate within the housing. The aluminum housing also provides a good electromagnetic interference (EMI) shield protecting sensitive electronic components from external electromagnetic radiation as well as reducing electromagnetic radiation emanating from the portable computing device.

The top case can be provided and shaped to accommodate an audio jack module. Conventional mounting configurations for audio jack modules generally affix the audio jack module to one side of a main logic board. By aligning that one side of the main logic board (MLB) with an audio jack opening, the main logic board can provide support for the audio jack as audio jack plugs are inserted and removed from the portable computing device. This conventional mounting configuration can be undesirable for a number of reasons. For example, using the MLB as support for the audio jack module can require that the MLB has a particular position with respect to the top case. This can be a problem in those situations where the MLB must be positioned elsewhere. Moreover, with conventional MLB designs, edge portions of the MLB can be populated with a number of components that can leave little or no room for placement of the audio jack assembly. In addition to design considerations, reliability may suffer since multiple insertion and removal events at the audio jack module can eventually cause fatigue on the MLB eventually resulting in a failure of the connection between the audio jack assembly and the MLB.

Accordingly, these problems can be essentially eliminated by mounting the audio jack assembly directly to the top case. In this way, the audio jack assembly can be supported directly by the top case greatly reducing the risk of damage to the MLB. Furthermore, since the audio jack assembly can be electrically connected to the main logic board via a flex connector, the relative positioning of the MLB and audio jack assembly can be greatly varied.

These and other embodiments are discussed below with reference to FIGS. 1-10. However, those skilled in the art will readily appreciate that the detailed description given herein with respect to these figures is for explanatory purposes as the invention extends beyond these limited embodiments.

FIGS. 1-10 show various views of a portable computing device in accordance with various embodiments. FIG. 1 shows a front facing perspective view of an embodiment of the portable computing device in the form of portable computing device 100 in an open (lid) state. Portable computing device 100 can include base portion 102 formed of bottom case 104 fastened to top case 106. Base portion 102 can be pivotally connected to lid portion 108 by way of clutch assembly 110 hidden from view by a cosmetic wall. Base portion 102 can have an overall uniform shape sized to accommodate clutch assembly 110 and inset portion 112 suitable for assisting a user in lifting lid portion 108 by, for example, a finger. Top case 106 can be configured to accommodate various user input devices such as keyboard 114 and touchpad 116. Keyboard 114 can include a plurality of low profile keycap assemblies each having an associated key pad 118. In one embodiment, an audio transducer (not shown) can use selected portions of keyboard 114 to output audio signals such as music. In the described embodiment, a microphone can be located at a side portion of top case 106 that can be spaced apart to improve frequency response of an associated audio circuit.

Each of the plurality of key pads 118 can have a symbol imprinted thereon for identifying the key input associated with the particular key pad. Keyboard 114 can be arranged to receive a discrete input at each keypad using a finger motion referred to as a keystroke. In the described embodiment, the symbols on each key pad 118 can be laser etched thereby creating an extremely clean and durable imprint that will not fade under the constant application of keystrokes over the life of portable computing device 100. In order to reduce component count, a keycap assembly can be re-provisioned as a power button. For example, key pad 118-1 can be used as power button 118-1. In this way, the overall number of components in portable computing device 100 can be commensurably reduced.

Touch pad 116 can be configured to receive finger gesturing. A finger gesture can include touch events from more than one finger applied in unison. The gesture can also include a single finger touch event such as a swipe or a tap. The gesture can be sensed by a sensing circuit in touch pad 116 and converted to electrical signals that are passed to a processing unit for evaluation. In this way, portable computing device 100 can be at least partially controlled by touch.

Lid portion 108 can be moved with the aid of clutch assembly 110 from the closed position to remain in the open position and back again. Lid portion 108 can include display 120 and rear cover 122 (shown more clearly in FIG. 2) that can add a cosmetic finish to lid portion 108 and also provide structural support to at least display 120. In the described embodiment, lid portion 108 can include mask (also referred to as display trim) 124 that surrounds display 120. Display trim 124 can be formed of an opaque material such as ink deposited on top of or within a protective layer of display 120. Display trim 124 can enhance the overall appearance of display 120 by hiding operational and structural components as well as focusing attention onto the active area of display 120.

Display 120 can display visual content such as a graphical user interface, still images such as photos as well as video media items such as movies. Display 120 can display images using any appropriate technology such as a liquid crystal display (LCD), OLED, etc. Portable computing device 100 can also include image capture device 126 located on a transparent portion of display trim 124. Image capture device 126 can be configured to capture both still and video images. Lid portion 108 can be formed to have uni-body construction that can provide additional strength and resiliency to lid portion 108 which is particularly important due to the stresses caused by repeated opening and closing. In addition to the increase in strength and resiliency, the uni-body construction of lid portion 108 can reduce overall part count by eliminating separate support features.

Data ports 128-132 can be used to transfer data and/or power between an external circuit(s) and portable computing device 100. Data ports 128-132 can include, for example, input slot 128 that can be used to accept a memory card (such as a FLASH memory card), data ports 130 and 132 can be used to accommodate data connections such as USB, FIREWIRE (IEEE 1394 Interface), THUNDERBOLT (port combining PCIe and DisplayPort into a serial signal), and so on. In some embodiments, speaker grid 134 can be used to port audio from an associated audio component enclosed within base portion 102.

Figure 2:
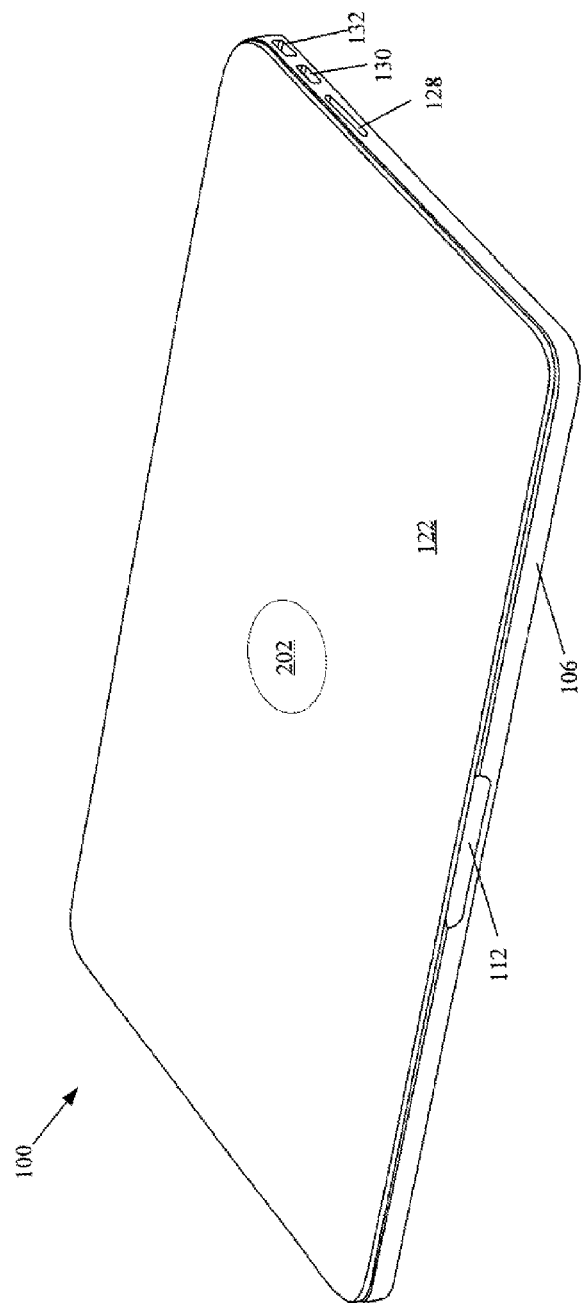
FIG. 2 shows portable computing device in a closed (lid) configuration that shows rear cover and logo.

FIG. 2 shows portable computing device 100 in a closed (lid) configuration that shows rear cover 122 and logo 202. In one embodiment, logo 202 can be illuminated by light from display 120. It should be noted that in the closed configuration, lid portion 108 and base portion 102 form what appears to be a uniform structure having a continuously varying and coherent shape that enhances both the look and feel of portable computing device 100.

Figure 3:
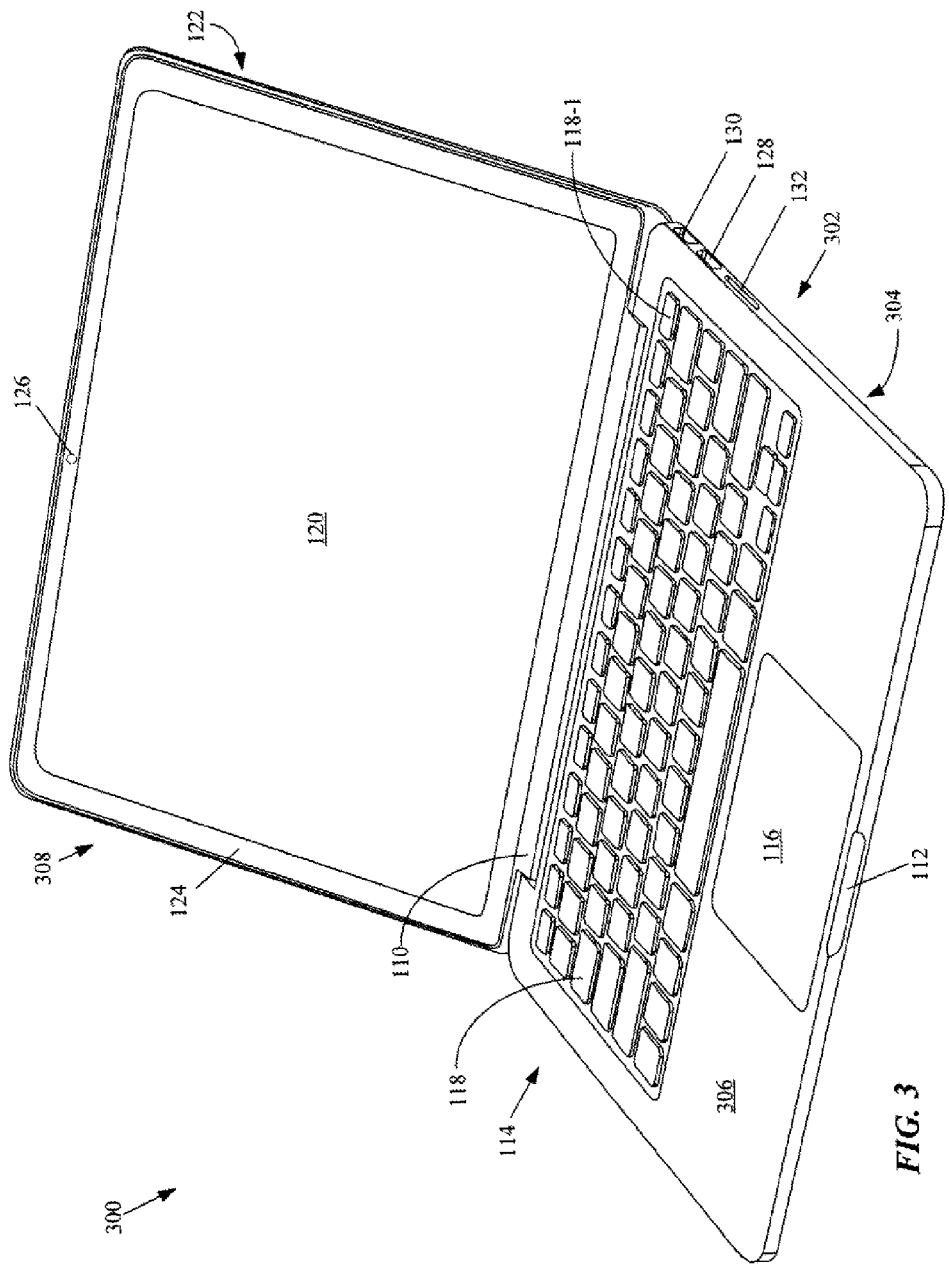
FIG. 3 shows another embodiment of the portable computing device in an open state.

FIG. 3 shows another embodiment in the form of portable computing device 300 that is smaller than portable computing device 100. Since portable computing device 300 is smaller in size than portable computing device 100, certain features shown in FIG. 1 are modified, or in some cases lacking, in portable computing device 300. For example, base portion 302 can be reduced in size such that separate speakers (such as speaker grid 134) are replaced with an audio port embodied as part of keyboard 114. However, bottom case 304 and top case 306 can retain many of the features described with regards to portable computing device 100 (such as display 120 though reduced to an appropriate size).

Figure 4:
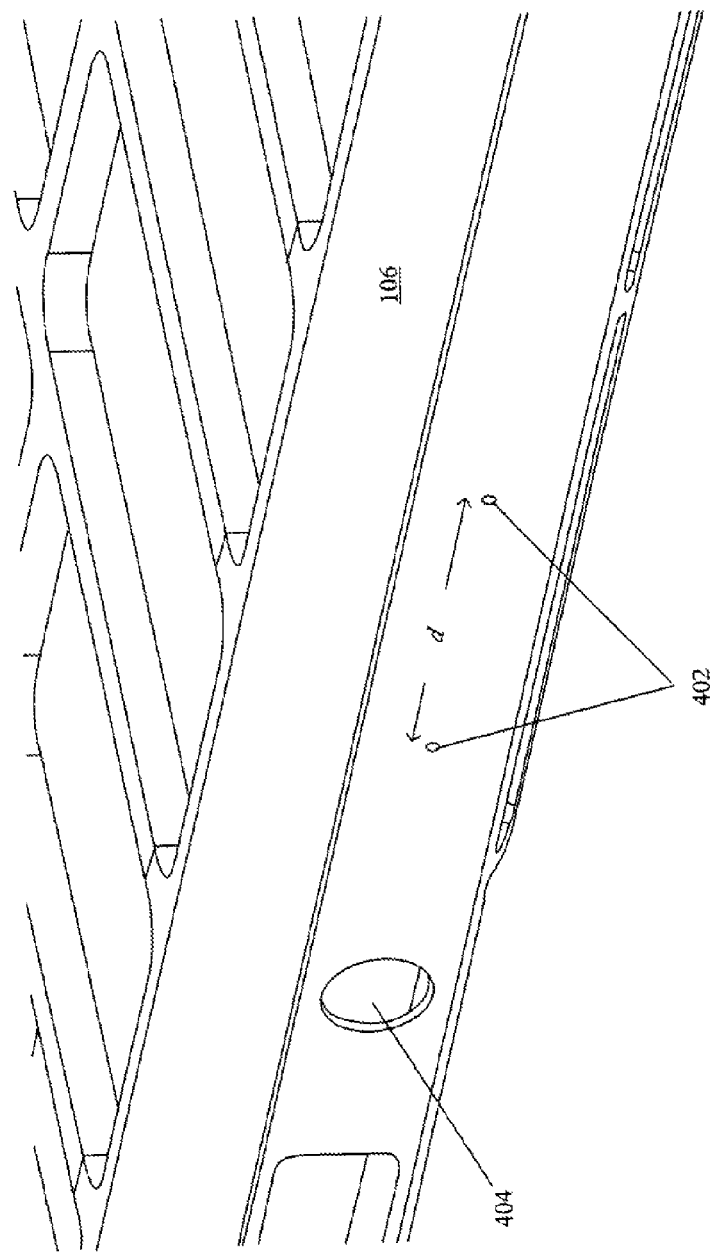
FIG. 4 shows an external perspective view of an audio jack opening machined into a side portion of a unibody portable computing device enclosure in accordance with the described embodiment.

FIG. 4 shows an embodiment of top case 106 having microphone openings 402 suitable for receiving audio signals and audio jack opening 404. In this embodiment, microphone openings 402 are spaced apart distance "d" in order to facilitate error correction in speech recognition algorithms. Distance d can vary depending upon a desired frequency response. For example, distance d can be on the order of about 15 mm. Also shown in FIG. 4 is audio jack opening 404. Audio jack opening 404 provides an opening to allow users access to an audio jack assembly located within top case 106 at audio jack opening 404. In one embodiment audio jack opening 404 can be sized to accept a 3.5 mm audio jack plug while in other embodiments it can be sized to accept a 2.5 mm audio jack plug. The audio jack assembly can be configured to determine what type of audio device is connected to it. In this way the audio jack assembly can take the role of both a headphone jack and a microphone jack, thereby saving space for other components inside the portable computing device. This switchable jack can be useful in situations where a user desires privacy, or improved sound isolation while listening to audio content. Alternatively the switchable jack can be useful when that user wants to use a higher fidelity microphone than what is provided by the microphone positioned behind microphone openings 402.

Figure 5:
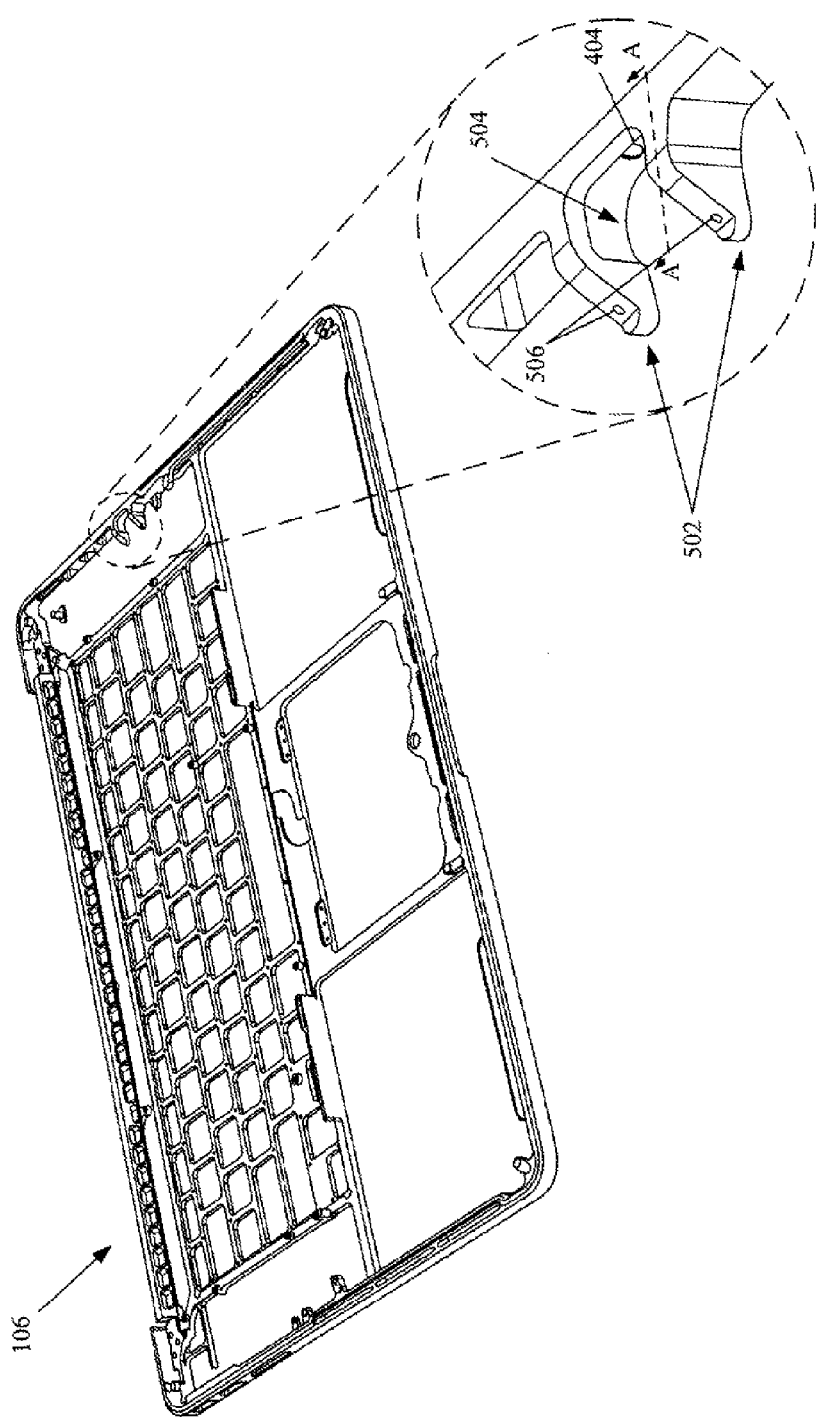
FIG. 5 shows a perspective view of the top case, identifying the location of audio jack mounts in accordance with one embodiment of the described embodiment.

FIG. 5 shows a perspective view of top case 106 highlighting the position of two audio jack mounts also referred to as flying bosses 502. Flying bosses 502 are disposed on a sidewall of top case 106 and can be CNC machined out of top case 106 while other features are being machined into top case 106. Flying bosses 502 can be arranged on either side of audio jack opening 404. Flying bosses 502 are spaced apart a distance sufficient to leave space for an audio jack assembly to fit between flying bosses 502. Inner cavity 504, defined in part by flying bosses 502, can be hollowed out to reduce the weight of top case 106, while still leaving sufficient structural capacity in flying bosses 502 to withstand insertion and removal events due to use of the audio jack assembly. Flying bosses 502 also include attachment features 506 for securely fastening an audio jack assembly to flying bosses 502. Attachment features 506 can be threaded to accept threaded audio jack assembly fasteners.

Figure 6:
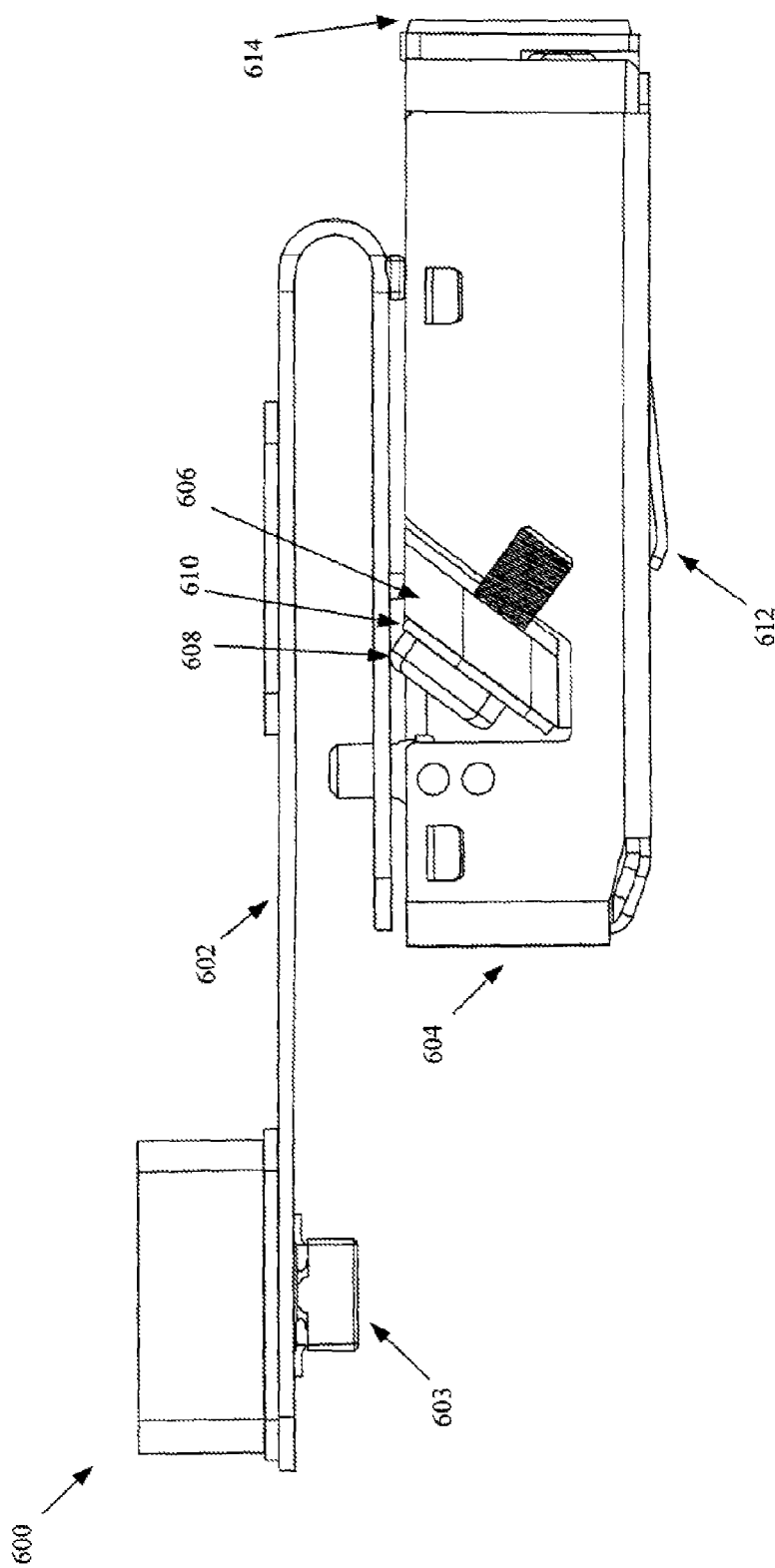
FIG. 6 shows an exterior side view of an audio jack assembly.

FIG. 6 shows a side view of audio jack assembly 600. Audio jack assembly 600 includes a flex connector 602, which electrically connects audio jack assembly 600 to the main logic board of the portable computing device through electrical connector 603. Audio jack assembly 600 also includes audio jack assembly housing 604, which encloses audio jack assembly circuitry. Audio jack assembly housing 604 also includes angled flanges 606, which extend laterally out from either side of audio jack assembly housing 604. In one embodiment angled flanges 606 can be made from plastic. Angled flanges 606 support threaded fasteners 608 which facilitate secure fastening of audio jack assembly 600 to flying bosses 502. Audio jack assembly 600 can also include metal washer 610 to grip the head portion of threaded fastener 608 as it is tightened against angled flange 606. Cantilevered support beam 612 extends from a bottom surface of audio jack assembly housing 604. Cantilevered support beam 612 can accomplish the following two functions: (1) when made of conductive material it can create a grounding path between audio jack assembly 600 and top case 106; and (2) it can help to set a fixed minimum stand off distance between a bottom surface of audio jack assembly housing 604 and an inner surface of top case 106. Also shown is angled connector portion 614 of audio jack assembly 600 which helps audio jack assembly 600 self align with audio jack opening 404 of top case 106. Cantilevered support beam 612 and angled connector portion 614 can ease insertion of audio jack assembly 600 into top case 106 during a manufacturing operation.

Figure 7:
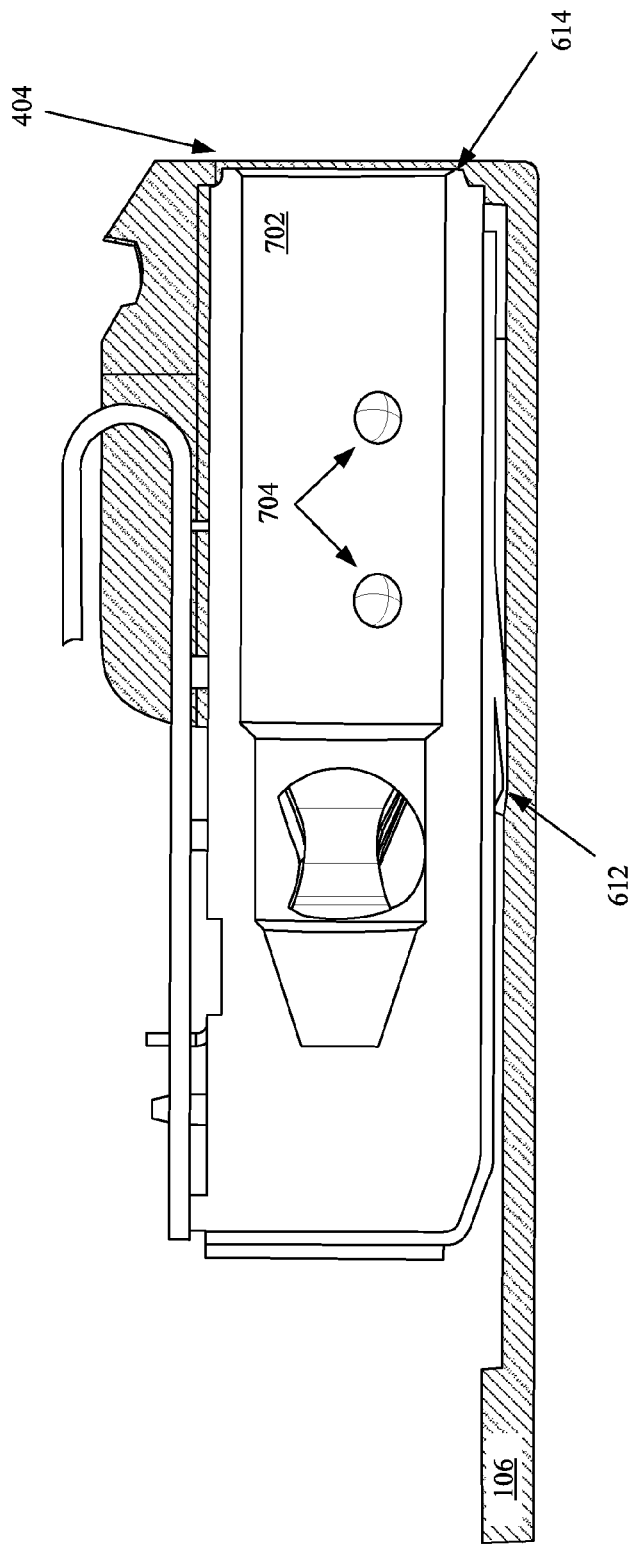
FIG. 7 shows an interior cross-section of an audio jack assembly illustrating how its geometry can self align with an audio jack opening located on a portable computing device.

FIG. 7 shows a cross-sectional side view of audio jack assembly 600 inserted into top case 106 and aligned with audio jack opening 404. The cross-sectional side view runs down the center of audio jack assembly 600. As illustrated, cantilevered support beam 612 can be slightly compressed once angled connector portion 614 of audio jack assembly 600 is properly positioned against audio jack opening 404. In some embodiments cantilevered support beam 612 is compressed to set a proper distance between a lower surface of audio jack assembly housing 604 and top case 106. It should be noted that excessive pressure on cantilevered support beam 612 should be avoided as it can result in bowing of top case 106 in some embodiments. FIG. 7 also illustrates a view of audio jack assembly cavity 702. Audio jack assembly cavity 702 contains a number of contacts 704 designed to exchange information between portable computing device 100 and an audio plug attached to an accessory device inserted into audio jack assembly cavity 702. While angled connector portion 614 and cantilevered support beam 612 do help properly position audio jack assembly 600 correctly with respect to top case 106, audio jack assembly 600 must still be mechanically coupled to top case 106.

Figure 8:
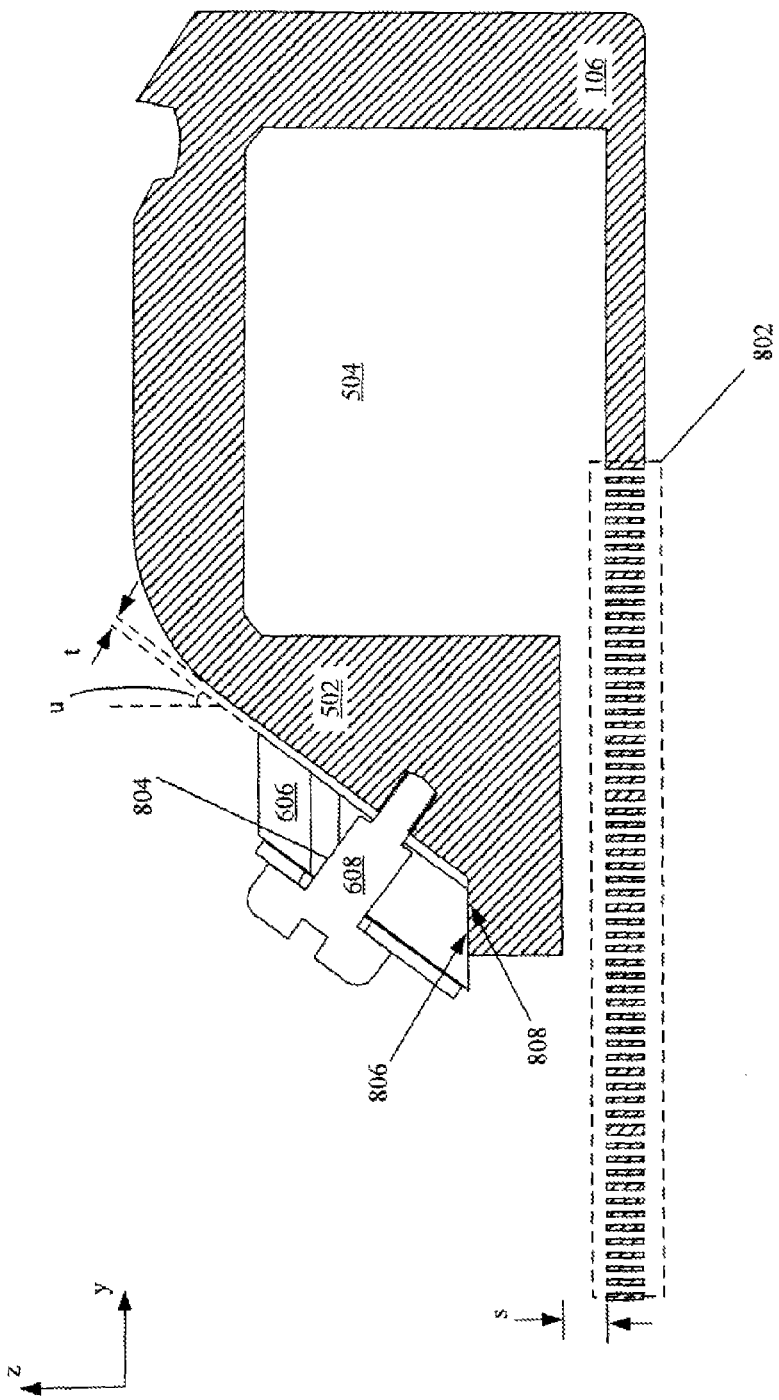
FIG. 8 shows a cross-sectional side view of one of two securing fastener for mounting an audio jack assembly to a portable computing device in accordance with the described embodiment.

FIG. 8 shows a cross-sectional side view of cross section A-A as defined in the close up view shown in FIG. 5. The cross-sectional side view shows a view of one of flying bosses 502. Lower surfaces of flying bosses 502 are machined away so that they are not in contact with speaker perforations 802. If flying boss 502 were in contact with speaker perforations 802 it would show through speaker perforations 802 thereby marring the overall look and finish of portable computing device 100. To remove this aesthetic problem a bottom portion of flying boss 502 can be machined away, creating a standoff distance "s", sufficient to prevent flying boss 502 from showing through speaker perforations 802. This machining step also prevents speaker perforations 802 from being acoustically affected. In this way the overall aesthetic look and acoustic performance of portable computing device 100 can be improved. In addition to creating stand off distance between flying bosses 502 and speaker perforations 802, audio jack assembly 600 must also have stand off from speaker perforations 802, as illustrated in previous figures. This stand off distance can be as small as a fraction of a millimeter in some embodiments, making proper positioning in the z-axis extremely important.

Inner cavity 504, also illustrated in FIG. 5, can be enlarged by machining away portions of flying bosses 502 to reduce the overall weight of top case 106 without substantially effecting the structural stability of flying bosses 502. Flying boss 502 can be designed to have a short distance "t" between itself and angled flange 606. Distance t allows subsequent inspection of engagement between threaded fastener 608 and flying boss 502. In this embodiment angle "u" can be about 37 degrees. By setting angle u to 37 degrees sheering force on threaded fastener 608 can be reduced when compared with a fastener arranged perpendicular with the direction of insertion and removal forces. At an angle of 37 degrees threaded fastener 608 can be oriented to efficiently oppose forces in both the Z and Y axes. It should be noted that other angled orientations of flying bosses 502 are within the scope of the described embodiment generally covering a range of between 30 and 70 degrees with respect to the Z-axis Threaded fastener 608 as illustrated, mechanically couples audio jack assembly 600 to top case 106 through flying boss 502. Threaded fastener 608 can be a shoulder screw having a non-threaded shoulder portion 804. Non-threaded shoulder portion 804 keeps threaded fastener 608 precisely positioned within angled flange 606 as it is screwed into flying boss 502. Because threaded fastener 608 is precisely positioned inside of angled flange 606, contact surface 806 of angled flange 606 comes into contact with lip portion 808 of flying boss 502 at a repeatable position. Interaction between contact surface 806 and lip portion 808 stops the forward travel of threaded fastener 608 into flying boss 502. Furthermore, the interaction between 806 and 808 also keeps audio jack assembly 600 aligned horizontally with respect to top case 106 once 806 and 808 are fully engaged. Another advantage of the described embodiment is that vertical position of audio jack assembly 600 can be adjusted higher or lower by changing the vertical position of lip portion 808, thereby adjusting the final vertical position of audio jack assembly 600. Vertical positioning of lip portion 808 can be adjusted during a CNC machining process by removing more or less metal from flying boss 502. Proper vertical positioning of audio jack assembly 600 is important as positioning the assembly too low can result in excessive pressure and bowing of top case 106 occurring in addition to undesired visibility of a bottom surface of audio jack assembly 600. When audio jack assembly 600 has too much stand off, alignment problems with audio jack opening 404 are the most typical problems faced. Consequently, precise positioning of audio jack assembly 600 in the z-axis is quite important.

Figure 9A:
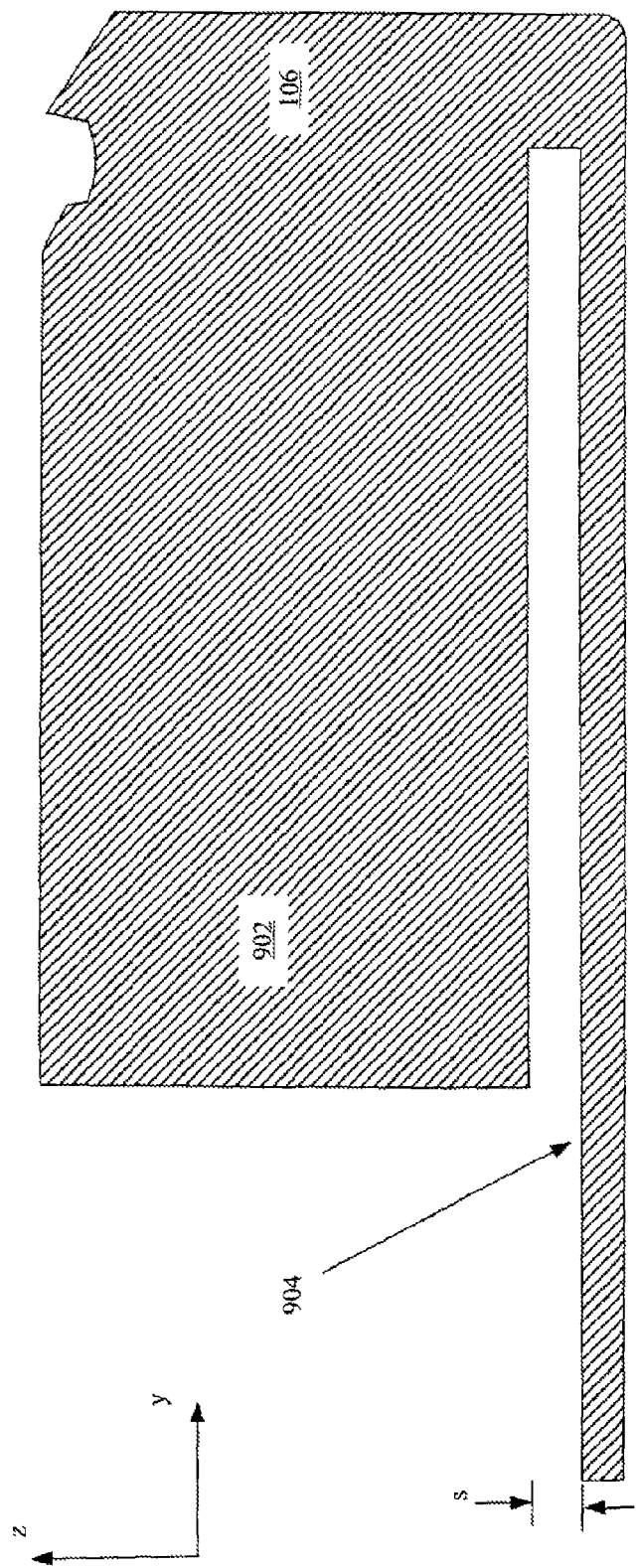
FIGS. 9A-9C show a method for machining a set of audio jack mounts into an interior sidewall of a portable computing device housing.
Figure 9B:
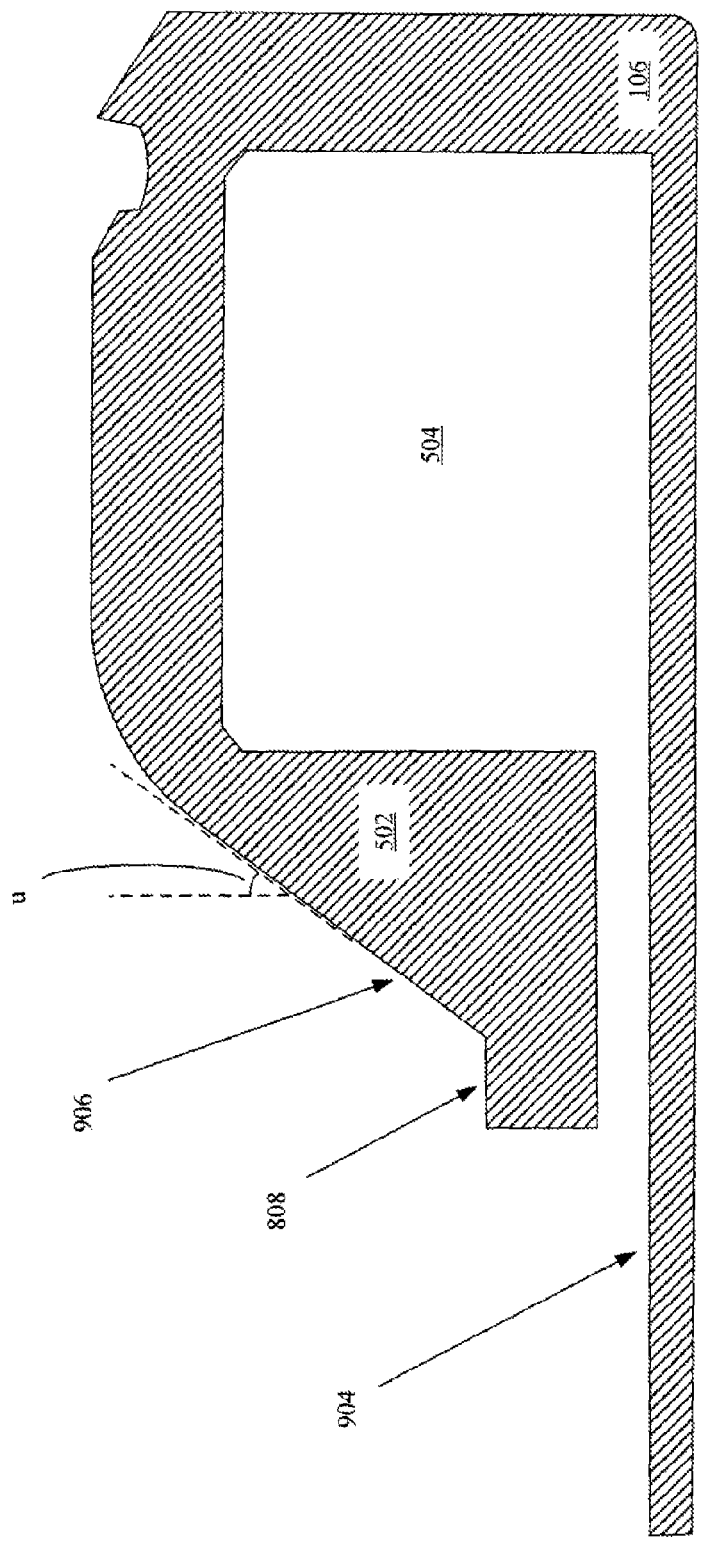
Figure 9C:
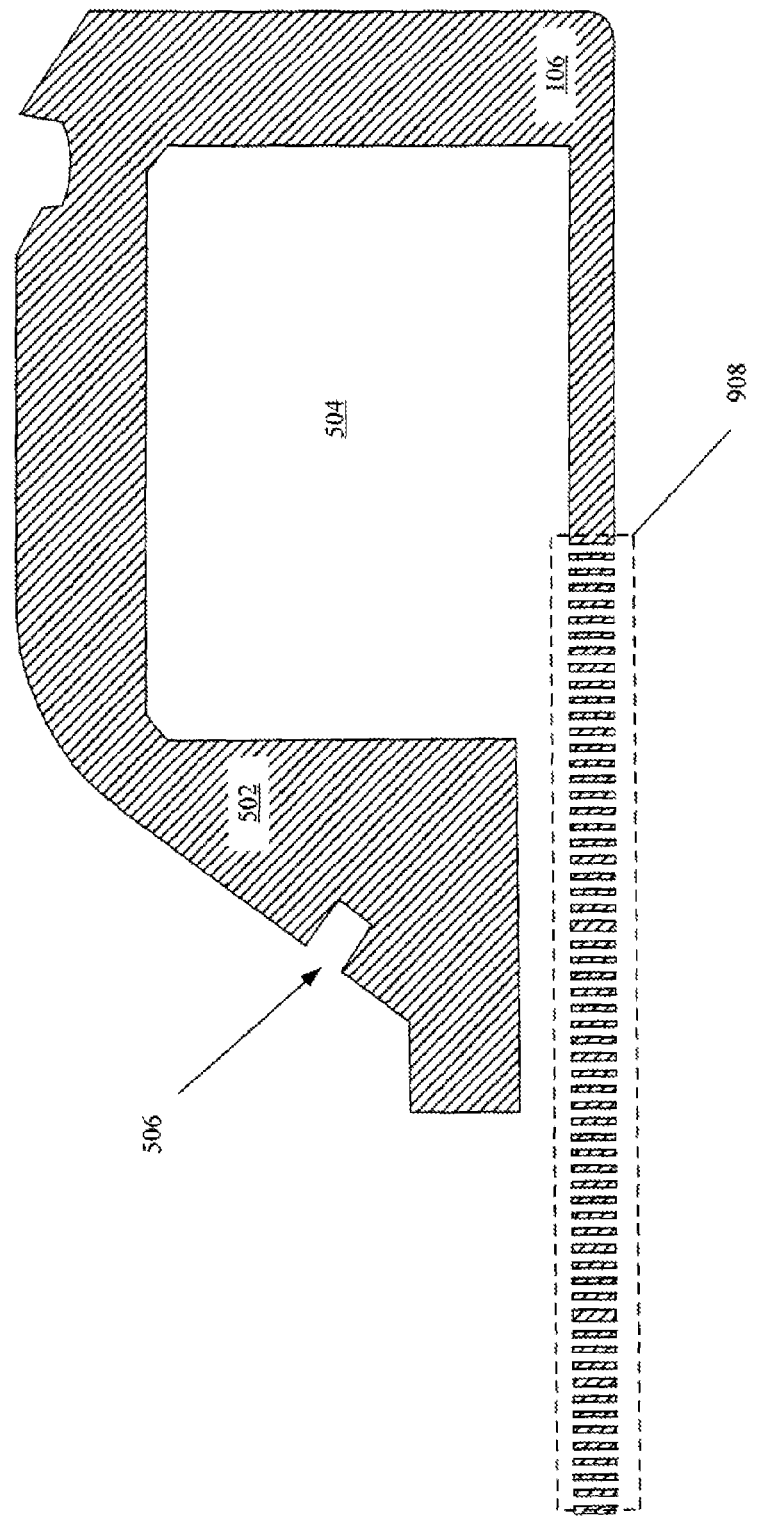

FIGS. 9A-9C illustrate a process by which flying bosses 502 can be machined from top case 106 of a portable computing device. Top case 106 can be made of any metal sufficiently rigid to house computer hardware necessary to drive the portable computing device. In one embodiment top case 106 can be made from aluminum. Advantageously, aluminum is conductive in nature and also operates as an EMI shield to insulate electrical components housed within top case 106. FIG. 9A shows a cross sectional view of a first manufacturing step in which protruding feature 902 is undercut by a thin saw, creating a standoff distance "s" between protruding block 902 and inner surface 904 of top case 106. This first step utilizing a thin saw to undercut protruding feature 902 can take place as part of a larger CNC machining process in which the rest of top case 106 is formed. It should be noted that there can be two protruding features 902 extending perpendicularly from a sidewall of top case 106 and separated by an interval large enough to allow audio jack assembly 600 to be inserted between them. FIG. 9B shows two additional steps in which protruding block 902 is machined into flying boss 502. An upper left portion of protruding block 902 is machined away creating angled surface 906 giving shape to flying boss 502. Angled surface, 906 can be formed at an angle u, oriented at between 30 and 70 degrees with respect to surface 901, which as previously explained allows fasteners to oppose insertion and removal events affecting audio jack assembly 600 without experience excessive shearing forces on the fasteners. Lip portion 808 can also be formed in this machining step having a surface substantially parallel to inner surface 904 of top case 106. Subsequently, inner cavity 504 can be machined from inside flying bosses 502. Inner cavity 504 extends only partially through flying bosses 502 in the x-axis, as was previously illustrated in FIG. 5. By machining inner cavity 504 into flying boss 502 weight reduction of top case 106 can be achieved without excessively reducing structural integrity of flying boss 502. FIG. 9C shows speaker perforations 908 and attachment feature 506 can be machined into flying boss 502 and top case 106 respectively. Because material has been undercut from flying boss 502, speaker perforations 908 can be punched or drilled through inner surface 904, thereby allowing audio to be easily transmitted through speaker perforations 908 without blockage from flying boss 502. In this way a light weight, integrated mount for an audio jack assembly can be machined into an interior side of a portable computing device enclosure without adversely affecting audio performance or overall aesthetics of speaker perforations 908.

Figure 10:
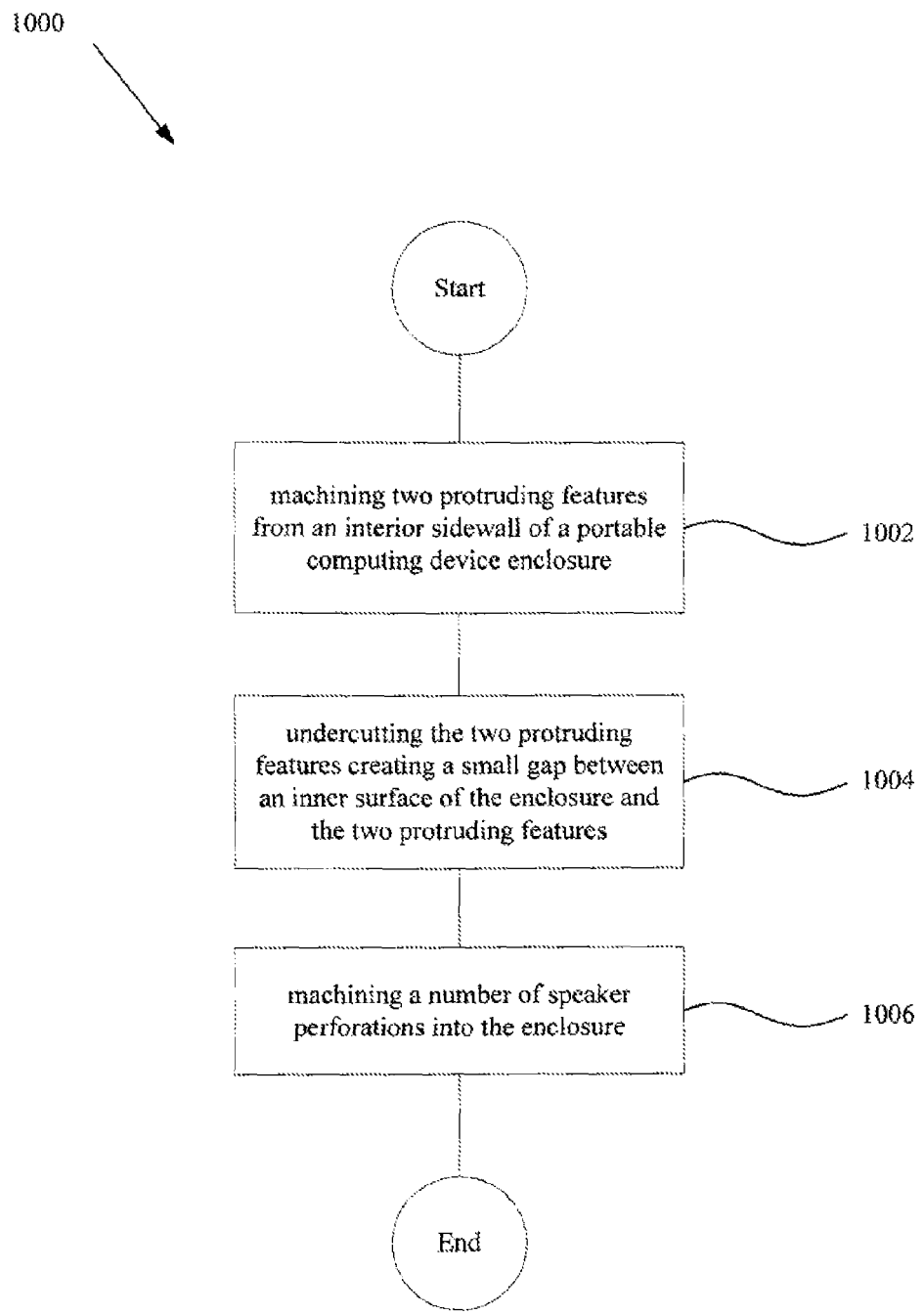
FIG. 10 shows a flow chart detailing a method for mounting an audio jack assembly inside a portable computing device.

FIG. 10 shows a flow chart detailing a method 1000 for installing an audio jack assembly directly to an interior sidewall of a portable computing device housing. In one embodiment the machining operations described can be carried out using a CNC machining process. In a first step 1002 a portable computing device housing is received and put through a series of machining operations, carving a number of features into interior portions of the portable computing device housing. In particular a set of two protruding features are machined out of an interior sidewall of the portable computing device. The protruding features can be machined at a distance leaving just enough space to insert an audio jack assembly between the two. In a second step 1004 the two protruding features are undercut creating a gap between the protruding features from a interior surface of the portable computing device housing. In a final step 1006 a number of speaker perforations are machined into the portable computing device housing, creating a speaker grill in the portable computing device housing. At least a portion of the resulting speaker grill has speaker perforations extending into the gap portion created by the undercutting operation. Consequently, the undercutting operation prevents the protruding features from covering or blocking speaker perforations in the speaker grill.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed is:

1. An electrical component, comprising:
a component housing, comprising:
a plurality of angled flanges extending laterally from the component housing each of the angled flanges being configured to be secured to one of a plurality of electrical component mounts disposed along an interior surface of a sidewall of a portable computing device housing, and
a support structure extending from a lower surface of the component housing and establishing a minimum stand off distance between the component housing and an inner surface of the portable computing device housing,
wherein a surface of each of the angled flanges interacts with a lip portion of each of the electrical component mounts to set a vertical position of the component housing inside the portable computing device housing when the angled flanges are secured to the plurality of electrical component mounts.

2. The electrical component as recited in claim 1, further comprising:
an angled connector portion for self aligning the electrical component with an opening in the sidewall of the portable computing device housing.

3. The electrical component as recited in claim 1, wherein the angled flanges are configured to be secured to the electrical component mounts by a plurality of fasteners.

4. The electrical component as recited in claim 3, wherein the plurality of fasteners are shoulder screws having an unthreaded shoulder portion for precise alignment of the shoulder screws within the angled flanges.

5. The electrical component as recited in claim 3, wherein the electrical component mounts are formed along the sidewall of the portable computing device housing by a machining operation.

6. The electrical component as recited in claim 5, wherein the electrical component mounts are undercut to prevent them from showing through a perforated speaker grill in the portable computing device housing located proximate to the electrical component mounts.

7. The electrical component as recited in claim 5, wherein an inner cavity is hollowed out of the electrical component mounts to reduce overall weight of the portable computing device housing without compromising the structural integrity of the electrical component mounts.

8. The electrical component as recited in claim 1, wherein the support structure comprises a cantilevered support beam that grounds the electrical component to the portable computing device housing.

9. The electrical component as recited in claim 4, wherein a metal washer is arranged between at least one of the fasteners and an angled flange.

10. The electrical component as recited in claim 1, wherein the electrical component is an audio jack assembly.

11. The electrical component as recited in claim 10, wherein the angled flanges are positioned at an angle which facilitates flat contact between the angled flanges and a portion of the electrical component mounts where attachment features are located.

12. The electrical component as recited in claim 1, wherein the angled flanges are oriented at an angle of between 30 and 70 degrees with respect to the component housing.

13. A method for mounting an electrical component to a housing of a portable computing device, the method comprising:
   machining two protruding features from an interior sidewall of the housing;
   undercutting the two protruding features creating a small gap between an inner surface of the housing and the two protruding features; and
   machining a plurality of speaker perforations into the top case,
   wherein at least one of the plurality of speaker perforation opens into the small gap created during the undercutting step.

14. The method as recited in claim 13, further comprising:
   machining an angled surface with an accompanying lip portion from a front portion of each of the protruding features; and
   machining an inner cavity into each of the two protruding features.

15. The method as recited in claim 14, further comprising mounting the electrical component to the angled surface of each of the protruding features,
   wherein the protruding features position the electrical component proximate to the inner surface of the housing through which the speaker perforations are machined.

16. The method as recited in claim 15, wherein an external surface of the electrical component is positioned within 1 millimeter of the inner surface of the top case.

17. The method as recited in claim 15, wherein the electrical component mounting step includes attaching a plurality of fasteners through angled flanges extending laterally from the electrical component and into attachment features located on the angled surface of the protruding features.

18. A portable computing device, comprising:
   a portable computing device housing, comprising:
      a perforated speaker grill, comprising a plurality of speaker perforations disposed through a wall of the portable computing device housing, and
      a plurality of mounting features disposed along an interior sidewall of the portable computing device housing; and
   an electrical component, comprising:
      a component housing,
      a plurality of angled flanges extending laterally from the component housing, each of the angled flanges coupling the electrical component with at least one of the mounting features, and
      a support structure extending from a surface of the component housing and establishing a minimum stand off distance between the component housing and a portion of the wall of the portable computing device housing that includes the speaker perforations.

19. The portable computing device as recited in claim 18, wherein the mounting features comprise two protruding features that are undercut to prevent the protruding features from showing through the perforated speaker grill.

20. The portable computing device as recited in claim 18, wherein a lip portion of the mounting features interacts with a surface of the angled flanges to establish a vertical position for the component housing within the portable computing device housing.

21. The portable computing device as recited in claim 20, wherein the support structure electrically grounds the component housing to the portable computing device housing.

* * * * *

UNITED STATES PATENT AND TRADEMARK OFFICE
CERTIFICATE OF CORRECTION

PATENT NO. : 8,837,128 B2  Page 1 of 1
APPLICATION NO. : 14/250279
DATED : September 16, 2014
INVENTOR(S) : Charles A. Schwalbach et al.

It is certified that error appears in the above-identified patent and that said Letters Patent is hereby corrected as shown below:

In the Claims:

Column 11, lines 12-13 (Claim 13, lines 9-10): "the top case," should read --the housing,--.

Column 11, line 31 (Claim 16, line 3): "the top case." should read --the housing.--.

Signed and Sealed this
Sixth Day of January, 2015

Michelle K. Lee
*Deputy Director of the United States Patent and Trademark Office*